United States Patent
Shibata et al.

(10) Patent No.: US 11,446,941 B2
(45) Date of Patent: Sep. 20, 2022

(54) INKJET APPARATUS AND METHOD FOR MANUFACTURING FUNCTIONAL ELEMENT USING THE SAME

(71) Applicant: CANON KABUSHIKI KAISHA, Tokyo (JP)

(72) Inventors: Naoari Shibata, Kawaguchi (JP); Norihiko Ochi, Kawasaki (JP); Junri Ishikura, Tokyo (JP); Masayuki Morohashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/002,972

(22) Filed: Aug. 26, 2020

(65) Prior Publication Data

US 2020/0391527 A1    Dec. 17, 2020

Related U.S. Application Data

(63) Continuation of application No. PCT/JP2019/006255, filed on Feb. 20, 2019.

(30) Foreign Application Priority Data

Feb. 28, 2018  (JP) .............................. JP2018-035078
Feb. 1, 2019    (JP) .............................. JP2019-017046

(51) Int. Cl.
  *B41J 2/165*   (2006.01)
  *B41J 25/00*   (2006.01)
  *H01L 51/00*   (2006.01)

(52) U.S. Cl.
  CPC ............. *B41J 25/006* (2013.01); *B41J 2/165* (2013.01); *B41J 2/16517* (2013.01); *H01L 51/0005* (2013.01)

(58) Field of Classification Search
  CPC ...... B41J 25/006; B41J 2/165; B41J 2/16517; H01L 51/0005
  See application file for complete search history.

(56) References Cited

U.S. PATENT DOCUMENTS

2009/0184993 A1* 7/2009 Yorimoto ............... B41J 29/393
                                                                      347/14
2010/0045735 A1* 2/2010 Sugahara ................. B41J 3/60
                                                                      347/29

FOREIGN PATENT DOCUMENTS

JP    56-076443 U    6/1981
JP    64-71760 A     3/1989
(Continued)

OTHER PUBLICATIONS

International Search Report dated May 7, 2019, in International Patent Application No. PCT/JP2019/006255.

*Primary Examiner* — Yaovi M Ameh
(74) *Attorney, Agent, or Firm* — Venable LLP

(57) ABSTRACT

An inkjet apparatus includes an inkjet head, a scanning mechanism, a surrounding portion surrounding a predetermined region in which the inkjet head is moved by the scanning mechanism in plan view of the substrate surface and which comprises a height at which a nozzle surface of the inkjet head is disposed in side view of the substrate surface, and a vapor supply portion provided outside the substrate surface and in the region surrounded by the surrounding portion in plan view of the substrate surface. The scanning mechanism is configured to control relative positions of the inkjet head and the substrate surface. The vapor supply portion is configured to supply a vapor of the same material as a component of a solvent contained in the ink to the region surrounded by the surrounding portion.

23 Claims, 13 Drawing Sheets

(56) References Cited

FOREIGN PATENT DOCUMENTS

| | | | | |
|---|---|---|---|---|
| JP | 2003-145783 | A | 5/2003 | |
| JP | 2004-000942 | A | 1/2004 | |
| JP | 2006-260778 | A | 9/2006 | |
| JP | 2006260778 | A  * | 9/2006 | ............ H05B 33/10 |
| JP | 2016-215096 | A | 12/2016 | |
| WO | 2009/051036 | A1 | 4/2009 | |

* cited by examiner

INKJET APPARATUS AND METHOD FOR MANUFACTURING FUNCTIONAL ELEMENT USING THE SAME

CROSS-REFERENCE TO RELATED APPLICATIONS

This application is a Continuation of International Patent Application No. PCT/JP2019/006255, filed Feb. 20, 2019, which claims the benefit of Japanese Patent Application No. 2018-035078, filed Feb. 28, 2018, and Japanese Patent Application No. 2019-017046, filed Feb. 1, 2019, both of which are hereby incorporated by reference herein in their entirety.

BACKGROUND OF THE INVENTION

Field of the Invention

The present invention relates to an inkjet apparatus used for applying an ink on a substrate surface having a large area. Particularly, the present invention relates to an inkjet apparatus suitably used for forming a functional element such as an organic electroluminescence element: OEL element, and a method for manufacturing the functional element using the inkjet apparatus.

Description of the Related Art

In recent years, forming a pattern by applying a material of a functional device by using an inkjet apparatus when manufacturing various functional elements has been attempted. Patterning using an inkjet apparatus has advantages such as high use efficiency of materials derived from possibility of on-demand patterning and relatively small size of a manufacturing apparatus derived from the patterning being a non-vacuum process.

Meanwhile, in the field of functional elements such as OEL elements, an enormous number of functional elements are often formed on a substrate of a large area, and therefore stability of operation is demanded for an inkjet apparatus. In an inkjet apparatus, a desired pattern is generally formed by individually controlling each nozzle of an inkjet head including hundreds to thousands of nozzles to eject an ink while moving the inkjet head in a scanning manner. If at least one nozzle fails ejection during pattern formation, the characteristics of a functional element formed by the nozzle are adversely affected. For example, in the case of manufacturing an image display apparatus in which a large number of OEL elements are arranged on a substrate, a pixel having defective light emission characteristics is sometimes formed.

Therefore, in the case of forming a pattern of a functional element by using an inkjet apparatus, the ejection state of each nozzle needs to be stabilized. Examples of the cause of the ejection becoming unstable include the ejection characteristics being affected by increase in the viscosity of the ink near the ejection port caused by evaporation of the ink from the ejection port, and clogging of the nozzle caused by drying and solidification of the ink. In addition, the examples also include an ink remaining in the vicinity of the nozzle and fine ink mist floating in the air drying and solidifying around and attaching to the nozzle and thus changing the shape of the ejection port or the physical properties of the ejection port such as wettability. Even if the ejection port is not clogged, when the size, ejection direction, or ejection speed of ink droplets is changed, for example, the hitting position of the ink is displaced, and the characteristics of the functional element becomes uneven.

Therefore, a method for suppressing drying of the nozzle to suppress the change in the ejection characteristics has been proposed.

Japanese Patent Laid-Open No. 2016-215096 proposes a method of suppressing drying of a nozzle in the case where ejection is not performed for a relatively long period, by, for example, replacing the substrate when manufacturing a functional element, or stopping the manufacture temporarily. Specifically, in the case of stopping the ejection operation for a relatively long period, the inkjet head is retracted to a position opposing an ink drying suppressing device provided on the side of a stage and fixing and holding the inkjet head in that position.

In addition, Japanese Patent Laid-Open No. 2003-145783 discloses an apparatus in which a holding member holding an ink solvent that moves accompanied by a nozzle of an inkjet head is disposed on each side of the nozzle and supplies a solvent atmosphere to a space between the nozzle and a substrate.

Generally, in the case of forming an enormous number of functional elements on a substrate having a large area, the material of the functional elements is applied while scanning an application region where the ink is to be applied by an inkjet head. FIG. 11 is a schematic perspective view for describing this, and illustrates a substrate 100, a substrate surface 101 that is a surface of the substrate 100 on which functional elements are to be formed, and functional elements 102. Although only 8×8 functional elements 102 are illustrated herein because this is a schematic diagram, actually an enormous number of functional elements can be formed.

Assuming that the substrate surface 101 is parallel to an X-Y plane, an unillustrated inkjet head is separated from the substrate surface 101 in a Z direction by a predetermined distance and is first moved on a trajectory 103 along a X direction serving as a main scanning direction, and a material of the functional elements 102 of one column is ejected. Then, when the inkjet head is moved to the outside of a region where the functional elements 102 are to be formed, that is, to the outside of the application region, the inkjet head is moved on a trajectory 104 by a predetermined distance in a Y direction serving as a sub-scanning direction, and then the movement direction thereof is changed to a −X direction. Then, a material of the functional elements 102 of another column is ejected while moving the inkjet head on a trajectory 105. Then, when the inkjet head is moved to the outside of the application region, the movement direction of the inkjet head is changed to the Y direction serving as a sub-scanning direction again, and the inkjet head is moved by a predetermined distance on a trajectory 106. Although a case where the inkjet head includes only one nozzle has been described herein for simpler description, the material of functional elements of a plurality of columns may be ejected in one time of movement in the main scanning direction in the case where the inkjet head includes a plurality of nozzles.

The ink is ejected onto the entirety of the application region while moving the inkjet head in a scanning manner by repeating reciprocation of the inkjet head in the main scanning direction, and regions 107 for changing the trajectory of the inkjet head enclosed by dotted lines in FIG. 11 are provided on two sides of the application region.

The nozzle provided in the inkjet head repeatedly ejects the ink in an ejection pattern corresponding to the arrangement of the functional elements in the application region, and the nozzle is easily dried at a timing for switching the scanning direction, that is, while moving in the regions 107 because ejection of the ink is stopped. In the case where the nozzle is dried while moving in the regions 107, the ejection characteristics of the ink becomes unstable, for example, in the initial stage of ejection for the next column, and the characteristics of the functional elements are likely to be affected. Therefore, in some cases, functional elements disposed in the vicinity of the edge of the substrate 100 do not achieve predetermined characteristics.

The method disclosed in Japanese Patent Laid-Open No. 2016-215096 is a technique of retracting the inkjet head to the vicinity of a drying suppressing device disposed outside of a stage and fixing and holding the inkjet head in a predetermined position in the case of stopping ejection of the ink for a relatively long period, for example, when replacing the substrate. Therefore, according to the technique of Japanese Patent Laid-Open No. 2016-215096, the drying occurring at the timing of switching the scanning direction, that is, while moving the inkjet head in the region 107, which is a problem described above, cannot be addressed.

In addition, the method disclosed in Japanese Patent Laid-Open No. 2003-145783 can be effective for suppressing the drying of the nozzle while moving the inkjet head in a certain direction at a constant speed, that is, while ejecting the ink in the application region. However, at the timing for switching the scanning direction, that is, while moving in the region 107, since the movement direction or speed of the inkjet head is changed, the air flow around the nozzle is disturbed, and the solvent atmosphere is not necessarily sufficiently supplied to the vicinity of the nozzle. Therefore, according to the technique disclosed in Japanese Patent Laid-Open No. 2003-145783, the drying occurring at the timing of switching the scanning direction, that is, while moving the inkjet head in the region 107, which is a problem described above, cannot be sufficiently addressed.

SUMMARY OF THE INVENTION

According to a first aspect of the present invention, an inkjet apparatus configured to apply an ink containing a material of a functional element on a substrate surface includes an inkjet head, a scanning mechanism, a surrounding portion surrounding a predetermined region in which the inkjet head is moved by the scanning mechanism in plan view of the substrate surface and which comprises a height at which a nozzle surface of the inkjet head is disposed in side view of the substrate surface, and a vapor supply portion provided outside the substrate surface and in the region surrounded by the surrounding portion in plan view of the substrate surface and configured to supply a vapor of the same material as a component of a solvent contained in the ink to the region surrounded by the surrounding portion. The scanning mechanism is configured to control relative positions of the inkjet head and the substrate surface such that the inkjet head and the substrate surface relatively reciprocate in a main scanning direction and such that the inkjet head and the substrate surface relatively move in a sub-scanning direction in a case where forward movement and backward movement are switched during the reciprocation.

Further features of the present invention will become apparent from the following description of exemplary embodiments with reference to the attached drawings.

DESCRIPTION OF THE EMBODIMENTS

First Embodiment

An inkjet apparatus of a first embodiment of the present invention and a method for manufacturing a functional element using the inkjet apparatus will be described below with reference to drawings.

Figure 1:
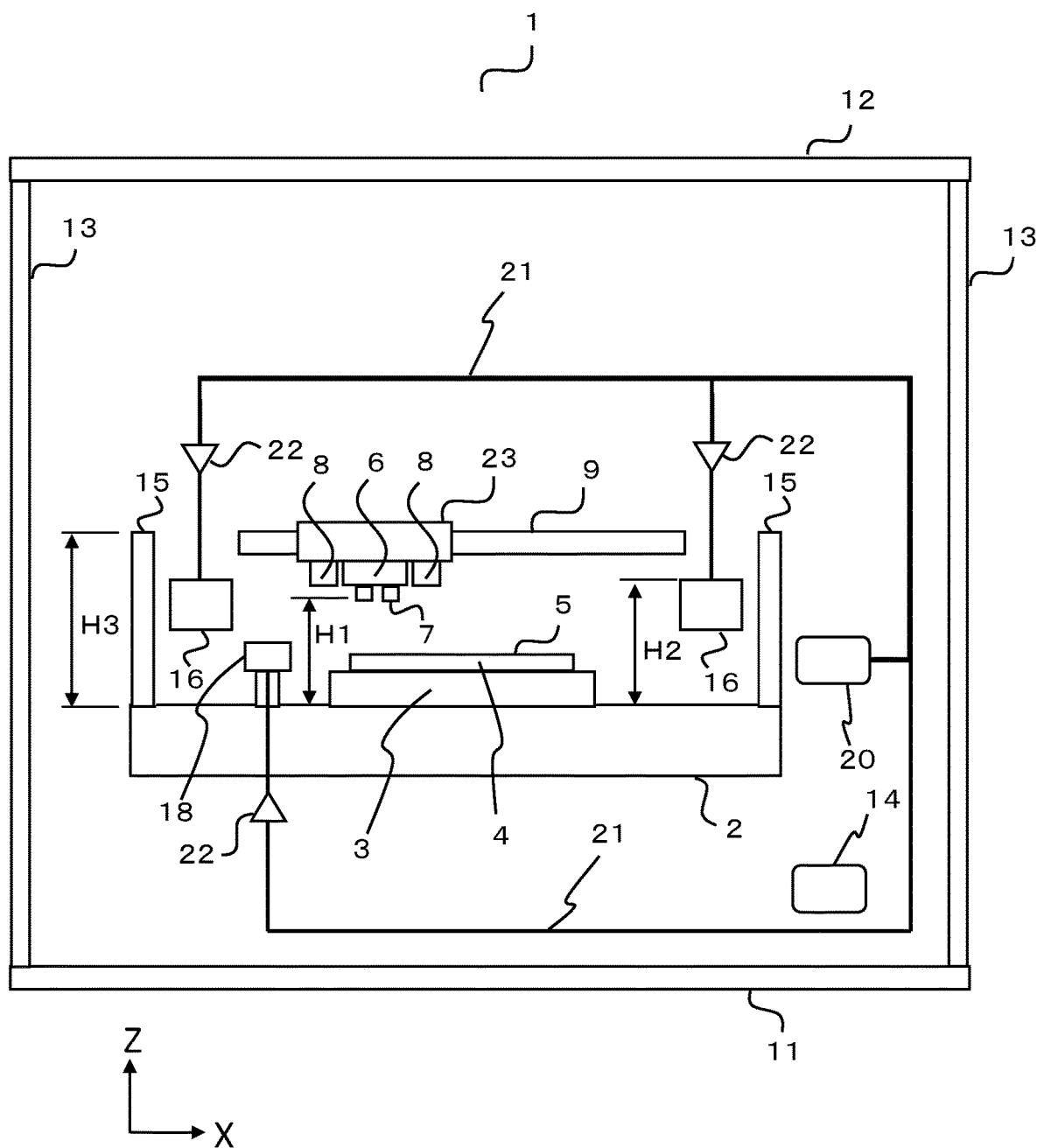
FIG. 1 is a schematic side view of an inkjet apparatus of a first embodiment.

FIG. 1 is a schematic side view of an inkjet apparatus 1 of the first embodiment. FIG. 1 illustrates a bottom plate 11, a top plate 12, and side plates 13 on four sides, and the bottom plate 11, the top plate 12, and the side plates 13 constitute an exterior cover of the inkjet apparatus 1. To be noted, in FIG. 1, illustration of the side plate 13 on the front side of the page surface is omitted to make it easier to see the inside of the apparatus.

Figure 2:
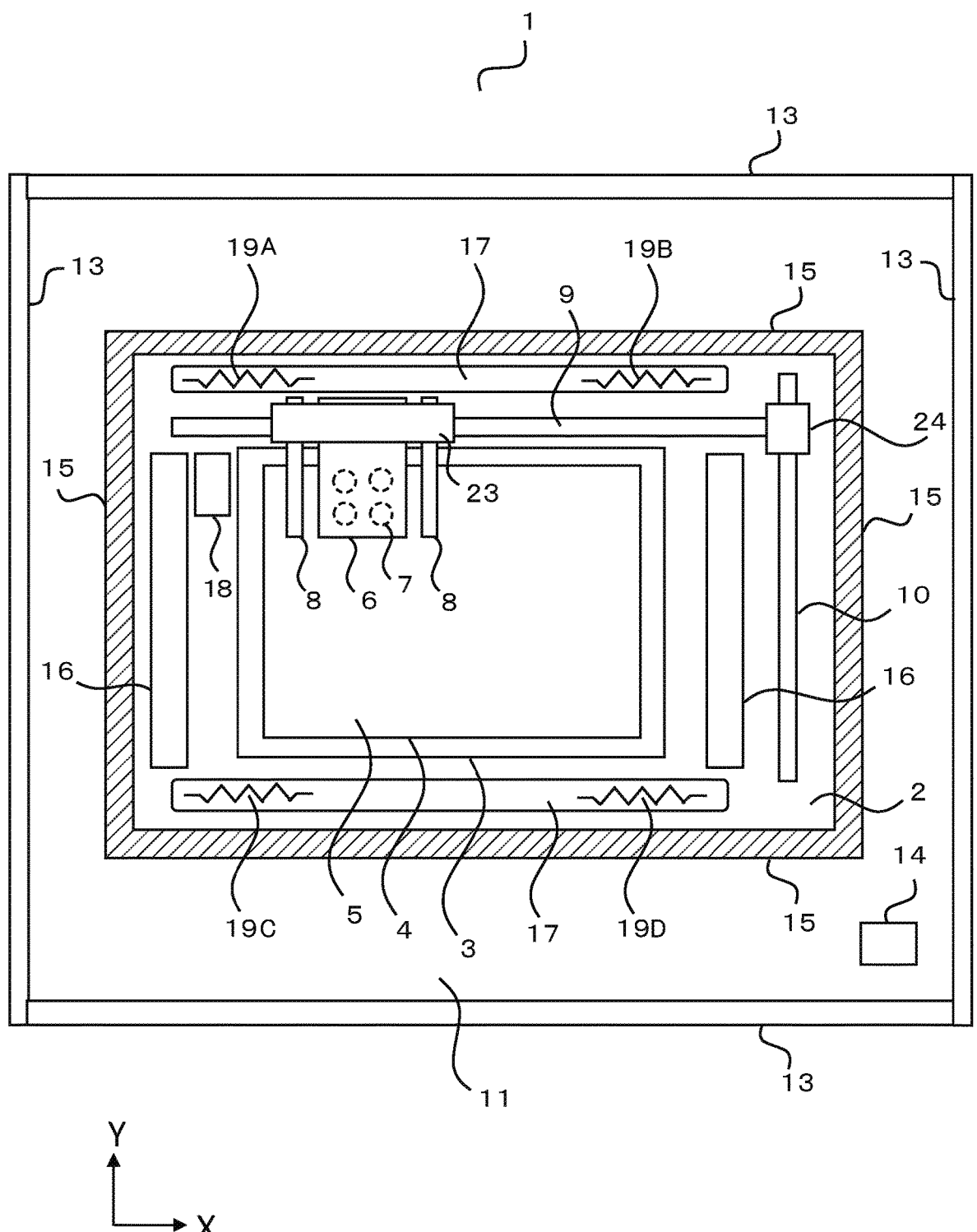
FIG. 2 is a schematic plan view of the inkjet apparatus of the first embodiment.

FIG. 2 is a schematic plan view of the inkjet apparatus 1 of the present embodiment as viewed from above. In FIG. 2, illustration of the top plate 12 is omitted to make it easier to see the inside of the apparatus.

Figure 11:
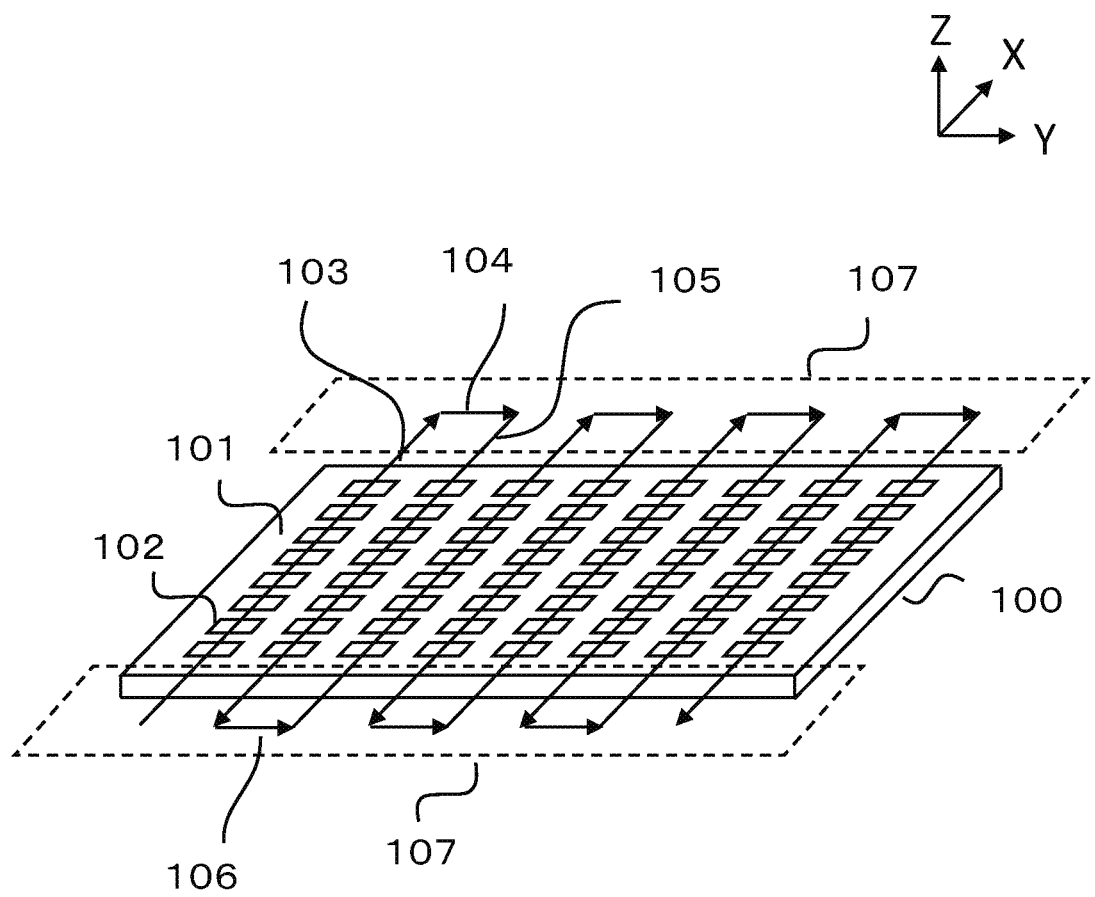
FIG. 11 is a perspective view of a substrate illustrating how an inkjet head is moved in a scanning manner.

Hereinafter, the configuration of the inkjet apparatus 1 will be described with reference to FIGS. 1 and 2. First, a substrate 4 serves as an object on which an ink serving as a raw material of functional elements is to be applied, and a substrate surface 5 serves as a surface on which the ink is to be applied. The substrate 4 and the substrate surface 5 respectively correspond to the substrate 100 and the substrate surface 101 described above with reference to FIG. 11. The substrate 4 is set in a predetermined position on a stage 3.

FIG. 2 illustrates an inkjet head 6 and nozzles 7, and the nozzles 7 are disposed in the inkjet head 6 in such a direction as to oppose the substrate surface 5. Although only 2×2=4 nozzles 7 are illustrated for the sake of convenience of illustration, the number and arrangement of the nozzles 7 are not limited to these.

The inkjet head 6 is supported by a scanning mechanism, and is configured such that the nozzles 7 can be moved in a scanning manner in a plane parallel to an X-Y plane at a height separate from the substrate surface 5 by a predetermined interval in a Z direction. That is, the inkjet apparatus 1 includes a main scanning guide rail 9 extending in an X direction serving as a main scanning direction, and a main scanner 23 movable in the X direction is placed on the main scanning guide rail 9. In addition, the inkjet apparatus 1 includes a sub-scanning guide rail 10 extending in a Y direction serving as a sub-scanning direction, and a sub scanner 24 movable in the Y direction is placed on the sub-scanning guide rail 10. Since the inkjet head 6 is fixed to the main scanner 23 and the main scanning guide rail 9 is fixed to the sub scanner 24, the inkjet head 6 can be moved in a scanning manner in a plane parallel to the X-Y plane. To be noted, in FIG. 1, illustration of the sub scanner 24 and the sub-scanning guide rail 10 is omitted for simplicity of illustration.

In the main scanner 23, atmosphere sensors 8 are provided on respective sides of the inkjet head 6 in the X direction. The atmosphere sensors 8 measure the concentration of vapor of a solvent of the ink included in the atmosphere in the vicinity of the inkjet head 6 while moving together with the inkjet head 6, and transmit the measurement results to a controller 14.

In addition, solvent vapor supply portions 16 are disposed on respective sides of the substrate 4 in the X direction serving as the main scanning direction such that the substrate 4 is interposed therebetween. That is, the solvent vapor supply portions 16 are disposed in the regions 107 described above with reference to FIG. 11 in which the trajectory of the inkjet head is changed.

The solvent vapor supply portions 16 supply vapor of the same material as a component contained in the solvent of the ink ejected from the nozzles 7 of the inkjet head 6 to the atmosphere therearound. Here, for example, in the case where the ink contains a plurality of kinds of solvents, the vapor of the same material as a component contained in the solvent of the ink refers to vapor of all or part of the plurality of kinds of solvents.

In the apparatus of the present embodiment, the vapor concentration in the space around the solvent vapor supply portions 16 can be increased by, for example, impregnating a porous body such as a sponge or a member having a large surface area such as aggregation of fibers with a liquid of the same material as a component contained in the solvent of the ink and disposing the impregnated member therein. By using the solvent vapor supply portions 16, vapor of a component contained in the solvent of the ink can be supplied in advance to the outside of the application region, that is, to the space where the scanning direction of the inkjet head is switched in the regions 107 of FIG. 11.

The solvent vapor supply portions 16 are connected to a liquid supply system including a tank 20 that retains the liquid of the same material as the component contained in the solvent of the ink, a liquid flow path 21, and valves 22. The valves 22 connected to the respective solvent vapor supply portions 16 are individually controlled on the basis of instructions issued from the controller 14 to control the flow rate and opening/closing thereof. In other words, the controller 14 appropriately controls the supply amount of liquid to the respective solvent vapor supply portions 16.

In the inkjet apparatus 1 of the present embodiment, for example, a material whose vapor density is higher than that of air, such as xylene, is used as the solvent of the ink. To be noted, the vapor density refers to a mass ratio with respect to the air at the same temperature, same pressure, and same volume in the case where the average molecular weight of the air is 28.8. In the present embodiment, the substrate 4 is set vertically below, that is, in −Z direction with respect to the inkjet head 6, and the ink is ejected vertically downward from the nozzles 7. In addition, a member surrounding the space where the inkjet head 6 passes to switch the scanning direction is disposed such that the vapor supplied from the solvent vapor supply portions 16, which is heavier than the air, stagnates in the space. That is, the region in the X-Y plane where the inkjet head 6 moves is surrounded by side walls 15, and a bottom wall 2 is provided on the bottom side of the region surrounded by the side walls 15 such that the side walls 15 and the bottom wall 2 collectively constitute a surrounding portion. To be noted, in FIG. 2, the side walls 15 are indicated with hatching to be visually easily recognizable.

The members are arranged such that the following relationship is satisfied in the case where the height of the nozzles 7 from the bottom wall 2 is H1, the height of the upper ends of the solvent vapor supply portions 16 from the bottom wall 2 is H2, and the height of the upper ends of the side walls 15 from the bottom wall 2 is H3.

$$H1<H2<H3$$

According to such arrangement, the solvent vapor heavier than the air is supplied from the solvent vapor supply portions 16 at positions higher the horizontal plane in which the nozzles 7 move during scanning, and is retained in the surrounded portion, or a tank portion, surrounded by the bottom wall 2 and the side walls 15.

Further, to make the solvent vapor be stably retained in the entirety of the region surrounded by the bottom wall 2 and the side walls 15, in the present embodiment, solvent pools 17 are provided around the substrate 4 such that the substrate 4 is interposed between the solvent pools 17 in the Y direction serving as a sub-scanning direction. The solvent pools 17 are open containers retaining a liquid of the same material as the component contained in the solvent of the ink ejected from the nozzles 7, and serve as a supply source of the solvent vapor. The inkjet apparatus 1 includes temperature adjustment mechanisms 19A, 19B, 19C, and 19D. The temperature adjustment mechanisms 19A to 19D are temperature adjustment mechanisms such as heaters, and are capable of adjusting the amount of generation of the vapor solvent from each position by adjusting the temperature of the solvent at each position in the solvent pools 17. Although the temperature adjustment mechanisms are disposed in respective ends of the solvent pools 17 having elongated shapes in the illustration of FIG. 2, the configuration of the solvent pools and temperature adjustment mechanisms is not limited to this example, and the shape, number, and arrangement thereof can be appropriately modified. To be noted, the solvent pools 17 are each connected to the tank 20 through an unillustrated liquid flow path and valves. The controller 14 is capable of controlling the supply amount of the liquid to each solvent pool 17 by valves, and controlling the amount of generation of the solvent vapor by the temperature adjustment mechanisms 19A to 19D.

In addition, in the present embodiment, a cleaning portion 18 for cleaning the surface of the nozzles 7 is provided adjacent to the stage 3 in the region surrounded by the bottom wall 2 and the side walls 15. At the time of cleaning, the controller 14 moves the nozzles 7 to a position opposing the cleaning portion 18, and moves the cleaning portion 18 in the Z direction to bring the cleaning portion 18 into contact with the nozzles 7. The cleaning portion 18 includes, as a cleaning member, for example, a wiping blade formed from rubber or a porous body such as a sponge. The wiping blade is connected to the liquid supply system constituted by the tank 20 that retains the liquid of the same material as a component contained in the solvent of the ink, the liquid flow path 21, and the valves 22. Foreign matter and solids attached to the nozzles 7 can be removed by bringing the wiping blade into contact with the nozzles 7 and wiping the nozzles 7, or sucking the nozzles 7 by using negative pressure generated by a pump.

Figure 3:
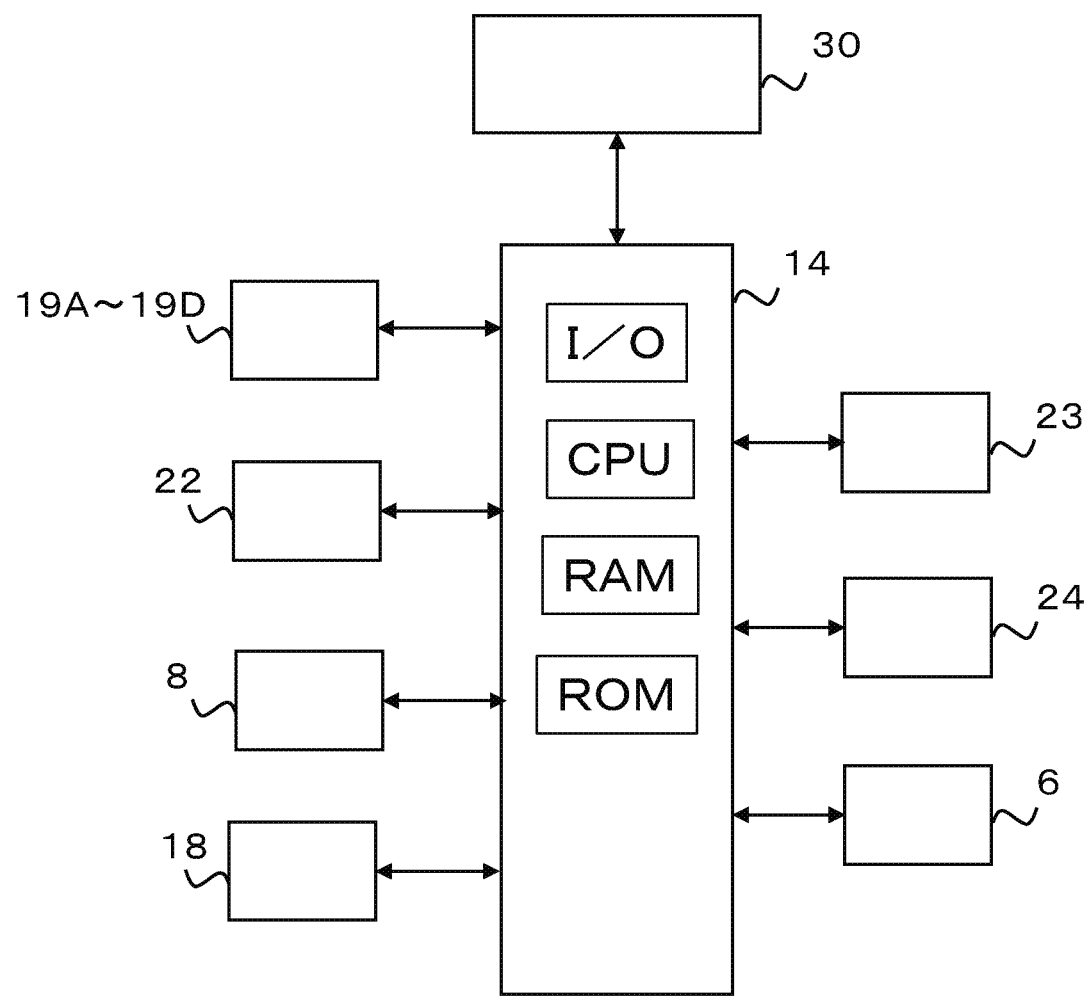
FIG. 3 is a control block diagram of an inkjet apparatus of embodiments.

Next, the control system of the inkjet apparatus 1 of the present embodiment will be described. FIG. 3 is a control block diagram schematically illustrating the control system of the inkjet apparatus 1. To be noted, for the sake of convenience of the illustration, only part of elements controlled by the controller is illustrated in FIG. 3.

The controller 14 is a computer for controlling the operation of the inkjet apparatus 1, and includes a central processing unit: CPU, a read-only memory: ROM, a random-access memory: RAM, an input/output port: I/O port, and so forth.

The ROM stores an operation program of the inkjet apparatus 1. Programs for executing various processes related to manufacture of the functional elements and control of the atmosphere using the solvent vapor may be stored in the ROM similarly to the other operation programs, or may be loaded onto the RAM from the outside via a network. Alternatively, the programs may be loaded onto the RAM via a computer-readable recording medium storing the programs.

The I/O port of the controller 14 is connected to an external apparatus 30 such as an external computer and to a network. The controller 14 can perform input/output of data required for manufacturing functional elements, such as the types, positions, arrangement, ink ejection conditions, and so forth of the functional elements to be manufactured, to and from the external computer via the I/O port.

The controller 14 is connected to the inkjet head 6, the main scanner 23, the sub scanner 24, the atmosphere sensors 8, the valves 22, the temperature adjustment mechanisms 19A to 19D, the cleaning portion 18, and so forth, and can input/output electric signals. The controller 14 controls the operation of each of these to execute general processing related to application of ink such as scanning movement of the inkjet head 6, ink ejection from the nozzles 7, measurement by the atmosphere sensors 8, supply of liquid to the solvent vapor supply portions 16 and the solvent pools 17, and cleaning of nozzles.

Next, atmosphere control of the present embodiment will be described. In the present embodiment, the concentration of solvent vapor at each position along a movement path of the inkjet head 6 can be measured by the atmosphere sensors 8 that move accompanied by the inkjet head 6. The controller 14 individually controls the valves 22 of respective positions and the temperature adjustment mechanisms 19A to 19D on the basis of the measured values of respective positions along the movement path, and performs control such that the concentration of solvent vapor at each position along the movement path of the nozzles 7 is equal to or higher than a predetermined concentration. For example, in the case where it is detected that the concentration of the solvent vapor in a certain region along the movement path is lower than the predetermined concentration, the controller 14 controls the valves and temperature adjustment mechanisms so as to increase the amount of supply of the solvent vapor from the solvent vapor supply portion 16 or the solvent pool 17 disposed in the vicinity of the region.

In the present embodiment, as a result of the control for supply of the solvent vapor and as a result of providing the surrounded portion, or a tank portion, surrounded by the bottom wall 2 and the side walls 15, the concentration of the solvent vapor in the entirety of the movement path of the nozzles 7 can be kept equal to or higher than a predetermined value. Therefore, in the course of the scanning movement of the inkjet head 6 for forming the functional elements, drying of the nozzles 7 can be suppressed even while the inkjet head 6 is moving in a region where ink is not ejected.

Next, a method of manufacturing functional elements on the substrate 4 by using the inkjet apparatus 1 of the present embodiment will be described. To be noted, in the description below, an OEL element of a top emission type will be described as an example of the functional element, and manufacturing method thereof will be described. However, the embodiment of the present invention is not limited to this example, and an OEL element of a different type or a functional element other than an OEL element may be manufactured.

First, the substrate 4 to be set in the inkjet apparatus 1 is prepared. FIGS. 4A to 4E are diagrams schematically illustrating each step for describing the procedure of preparing the substrate 4. In each diagram, a section of a region corresponding to one OEL element is schematically illustrated for the sake of convenience of illustration.

Figure 4A:
FIGS. 4A to 4E are each a diagram illustrating a part of a manufacturing process of an OEL element.

First, as illustrated in FIG. 4A, a substrate 41 is prepared. As the substrate 41, an inorganic material such as glass, or an organic material such as a resin is used. Although the substrate 41 is typically a plate-shaped member, the shape of the substrate 41 is not particularly limited as long as the substrate 41 can function as a substrate, and may be, for example, a deformable film.

Figure 4B:
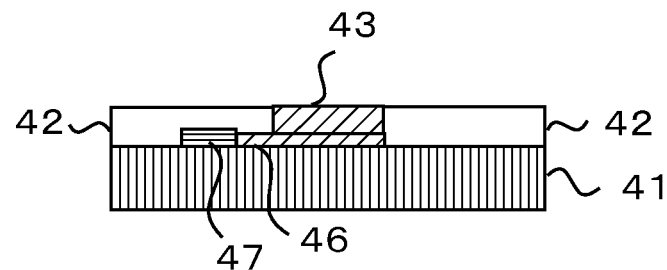

Next, a structure having a sectional structure illustrated in FIG. 4B is formed on the substrate 41. That is, a connecting electrode 46 and a thin film transistor: TFT 47 are provided on the substrate 41, and an insulating layer 42 is formed thereon. Then, a through hole is bored in a center portion of the insulating layer 42, and the through hole is filled with a metal material to form a plug 43. Further, a flattening process such as chemical metal polishing: CMP is performed to flatten the top surface of the insulating layer 42 and the plug 43.

Figure 4C:
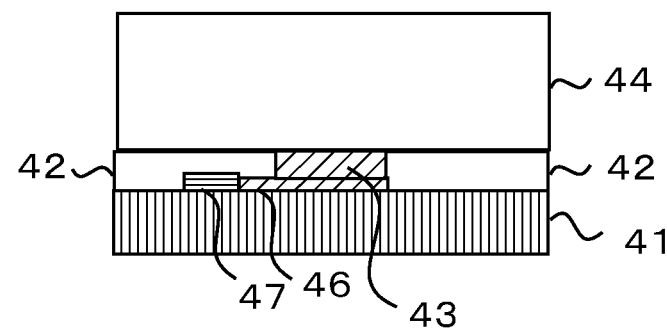

Next, as illustrated in FIG. 4C, an insulating layer 44 is formed. The insulating layer 44 is a layer provided for forming a bank portion of the OEL element. The insulating layer 44 is formed from an inorganic oxide such as $SiO_2$, or a resin such as polyimide or acrylic resin.

Figure 4D:
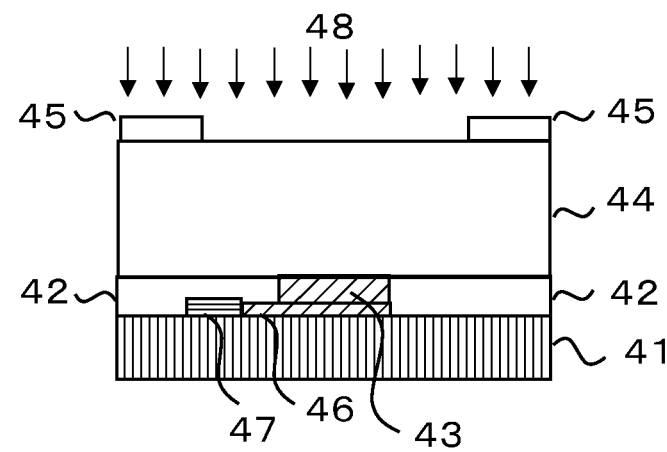

Next, a mask 45 having an opening portion as illustrated in FIG. 4D is disposed on the insulating layer 44 by, for example, using photolithography. Then, the insulating layer 44 is etched by, for example, reactive ion etching 48, and thus an opening portion through which the plug 43 is exposed is defined.

Figure 4E:
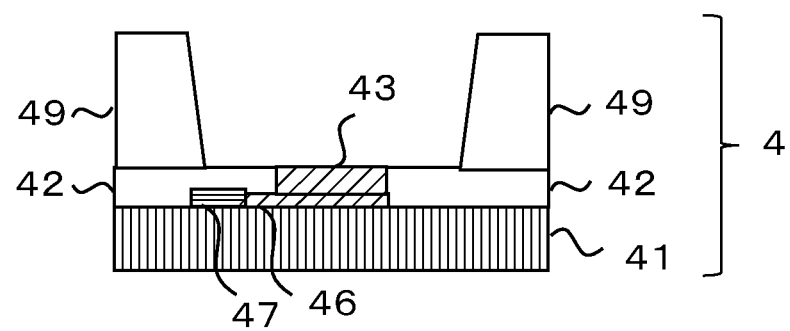

By removing the mask 45 after defining the opening portion, the substrate 4 in which the bank 49 is formed can be prepared as illustrated in FIG. 4E. At this time, the bank 49 can be formed by patterning the insulating layer 44 without violating the insulating layer 42 or the plug 43, by, for example, appropriately setting the conditions of the reactive ion etching or conditions of removal of the mask 45. After the patterning, UV ozone treatment or $O_2$ plasma treatment may be performed to remove the residue of the material.

In the case of arranging a plurality of OEL elements one-dimensionally or two-dimensionally, the bank 49 can be made to function as a wall that spatially separates or electrically insulates the OEL elements from each other. The opening of the bank 49 serves as a target position that a droplet of the ink should hit when an ink containing a material of the OEL element is ejected from the nozzles 7 of the inkjet apparatus 1.

After the substrate 4 is prepared as described above, the substrate 4 is set in a predetermined position on the stage 3 of the inkjet apparatus 1.

FIGS. 5A to 5D are diagrams schematically illustrating respective steps for describing the procedure of forming the laminate structure of the OEL element including application of ink by the inkjet apparatus 1. Although a section of a region corresponding to one OEL element is schematically illustrated for the sake of convenience of illustration in each diagram, application of ink is performed by moving the inkjet head 6 in a scanning manner on the entirety of the region where the OEL elements are to be formed, by a scanning procedure described with reference to FIG. 11. At this time, as a matter of course, the atmosphere control described above is performed to stabilize the concentration of the solvent vapor in the entirety of the movement path of the nozzles 7.

Figure 5A:
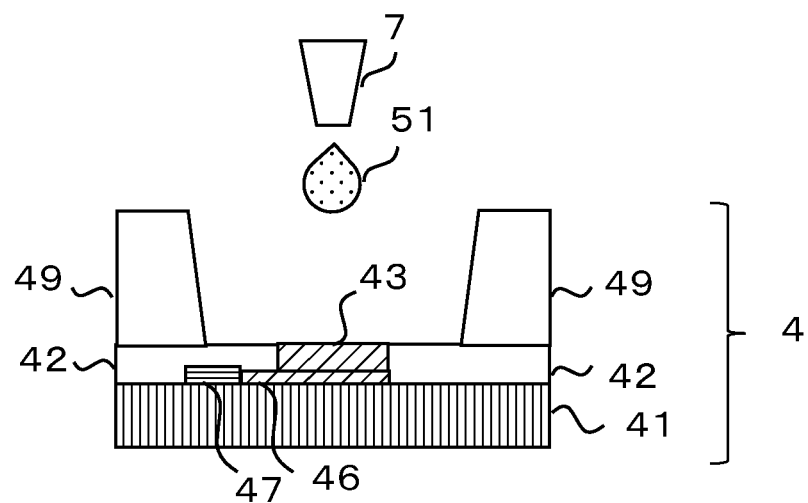
FIGS. 5A to 5D are each a diagram illustrating another part of the manufacturing process of the OEL element.

First, as illustrated in FIG. 5A, an ink 51 containing a material of a lower electrode is applied on a region surrounded by the bank 49 from the nozzles 7 of the inkjet apparatus 1. This serves as a lower electrode material application step. As the ink 51, a liquid in which conductive fine particles of Ag, Au, Cu, Al, Ni, or the like are dispersed in a solvent having a higher vapor density than the air is used. The ink 51 of an amount large enough to cover the exposed surface of the plug 43 and insulating layer 42 at the bottom surface of the bank opening and small enough to be retained by the bank 49 is applied.

Figure 5B:
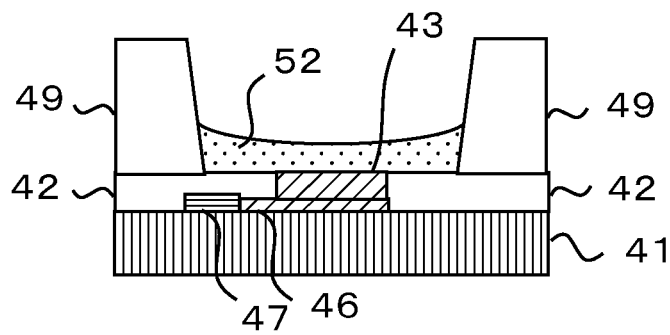

After applying droplets of a required number, the droplets are dried, and the substrate 4 is temporarily detached from the inkjet apparatus 1 and subjected to baking at an appropriate temperature within the range of 100° C. to 200° C. to form a lower electrode 52 as illustrated in FIG. 5B.

Figure 5C:
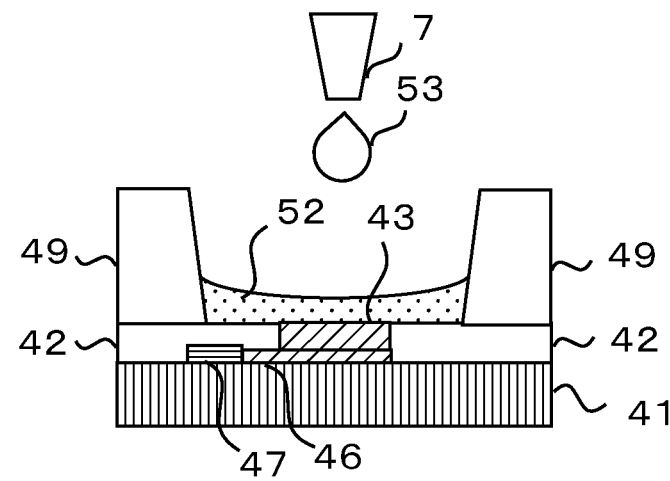

Next, the substrate 4 is set in the inkjet apparatus 1 again, and an ink 53 is applied on the region surrounded by the bank 49, and thus functional layers such as a light emitting layer and a hole injection layer are sequentially formed as illustrated in FIG. 5C. Of course, an ink containing a different material is used for a different layer to be formed. It is preferable to use a different inkjet head for forming a different layer.

For forming a light emitting layer 54 as a first functional layer, a first organic solvent-based ink in which a fluorescent organic compound or a phosphorescent organic compound corresponding to a desired emission color is dissolved in an organic solvent having a higher vapor density than the air, such as xylene, is applied and dried. This serves as a light emitting material application step.

In addition, the organic solvent-based ink for the light emitting layer may contain a plurality of materials such as a guest material and a host material. Examples of the light emitting material contained in the ink include high-molecular-weight materials, medium-molecular-weight materials, and low-molecular-weight materials, and are not particularly limited as long as the light emitting material can be used for application. For example, the examples include high-molecular-weight materials such as polyfluorene, copolymer of polyfluorene, and polyphenylene vinylene, medium-molecular-weight materials such as oligofluorene, and low-molecular-weight materials such as fluorene-based, pyrene-based, fluoranthene-based, and anthracene-based condensed polycyclic compounds and metal complexes including iridium. The light emitting layer 54 can preferably contain high-molecular-weight materials such as poly(p-phenylene vinylene) derivatives, polythiophene derivatives, poly(p-phenylene) derivatives, polysilane derivatives, polyacetylene derivatives, polyfluorene derivatives, and polyvinylcarbazole derivatives. To form a red-light emitting layer, for example, an ink for red-light emitting layer containing a red phosphorescent light emitting iridium metal complex as a guest material and polyfluorene as a host material is used. In addition, to form a green-light emitting layer, for example, an ink for green-light emitting layer containing a fluoranthene-based condensed polycyclic compound as a guest material and polyfluorene as a host material is used. In addition, to form a blue-light emitting layer, for example, an ink for blue-light emitting layer containing a pyrene-based condensed polycyclic compound as a guest material and oligofluorene as a host material is used.

When applying an ink for light emitting layer, an organic solvent-based ink of an amount large enough to cover the lower electrode 52 and small enough to be retained by the bank 49 is applied. After applying droplets of a required number, the droplets are dried to form the light emitting layer 54.

To form a hole injection layer 55 as a second functional layer, for example, a liquid of poly(3,4-ethylenedioxythiophene) doped with poly(4-styrenesulfonate): PEDOT/PSS liquid, which is a hole injection material, is applied as a second organic solvent-based ink. This serves as a hole injection layer forming step. Although the PEDOT/PSS liquid can be preferably used, the ink for hole injection layer is not limited to this, and for example, a hole injection layer can be also formed by applying and drying a liquid in which a high-molecular-weight material described below is dissolved in an organic solvent having a higher vapor density than the air. Examples of the high-molecular-weight material include phenylamine-based materials, starburst amine-based materials, phthalocyanine-based materials, hydrazone derivatives, carbazole derivatives, triazole derivatives, imidazole derivatives, and oxadiazole derivatives including an amino group.

When applying an ink for hole injection layer, an organic solvent-based ink of an amount large enough to cover the light emitting layer 54 and small enough to be retained by the bank 49 is applied. After applying droplets of a required number, the droplets are dried to form the hole injection layer 55.

Figure 5D:
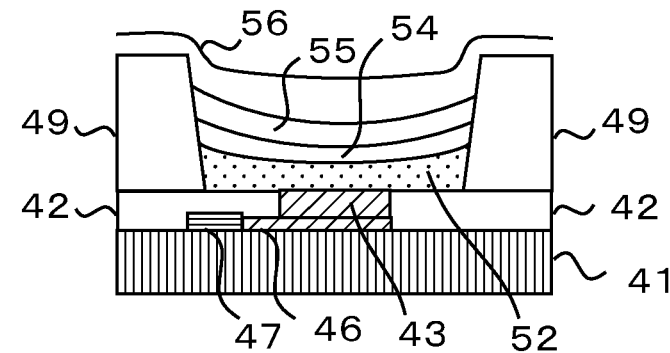

After the formation of the functional layer is completed in this manner, a transparent conductive film is formed to cover the functional layers and the bank 49 by, for example, sputtering film formation, and thus an upper transparent electrode 56 is formed as illustrated in FIG. 5D. This serves as an upper transparent electrode forming step.

According to the process described above, an OEL device in which a large number of OEL elements whose variation in the characteristics is small are arranged can be easily manufactured.

Second Embodiment

Figure 6:
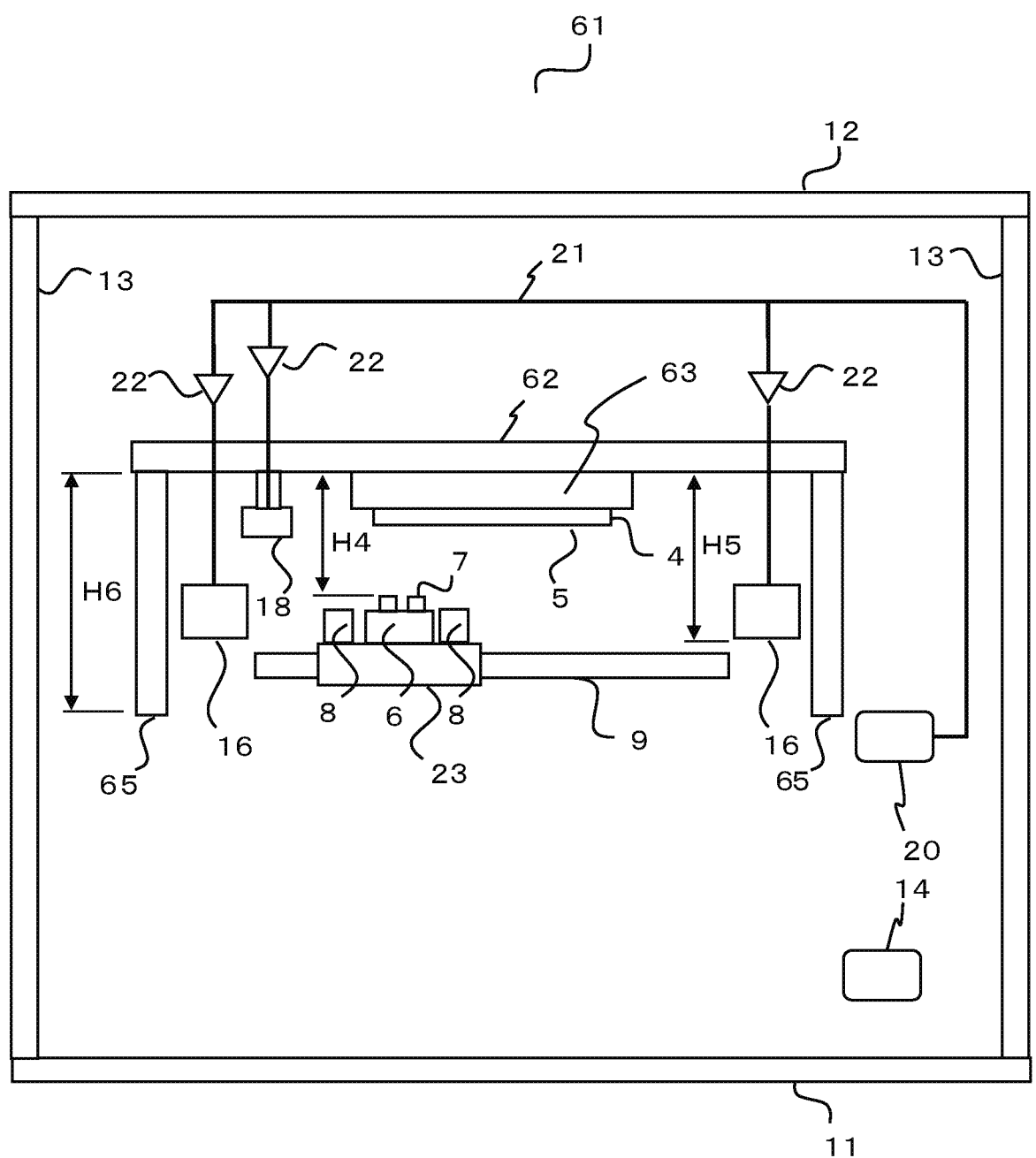
FIG. 6 is a schematic side view of an inkjet apparatus of a second embodiment.

An inkjet apparatus 61 of a second embodiment will be described with reference to FIG. 6. FIG. 6 is a schematic side view of the inkjet apparatus 61 of the second embodiment. FIG. 6 illustrates the bottom plate 11, the top plate 12, and the side plates 13 on four sides, and the bottom plate 11, the top plate 12, and the side plates 13 constitute an exterior cover of the inkjet apparatus 61. To be noted, in FIG. 6, illustration of the side plate 13 on the front side of the page surface is omitted to make it easier to see the inside of the apparatus.

The bottom plate 11, the top plate 12, the side plates 13, the inkjet head 6, the nozzles 7, the atmosphere sensors 8, the main scanning guide rail 9, the controller 14, the solvent vapor supply portions 16, the tank 20, the liquid flow path 21, and the valves 22 have the same functions as in the first embodiment, and therefore description thereof will be omitted. In addition, in FIG. 6, illustration of the sub scanner 24 and the sub-scanning guide rail 10 is omitted for the sake of simplicity of illustration.

In the inkjet apparatus 1 of the first embodiment, a material having a higher vapor density than the air such as xylene is used as the solvent of the ink. Therefore, the substrate 4 is set vertically below, that is, in the −Z direction with respect to the inkjet head 6, and the ink is ejected vertically downward from the nozzles 7. In addition, a member surrounding the space where the inkjet head 6 passes to switch the scanning direction is disposed such that the vapor supplied from the solvent vapor supply portions 16, which is heavier than the air, stagnates in this space. That is, the region in the X-Y plane where the inkjet head 6 moves is surrounded by side walls 15, and the bottom wall 2 is provided on the bottom side of the region surrounded by the side walls 15 such that the side walls 15 and the bottom wall 2 collectively constitute a surrounding portion.

In contrast, in the inkjet apparatus 61 of the second embodiment, a material having a lower vapor density than the air such as water is used as the solvent of the ink. Therefore, the substrate 4 is set on a stage 63 disposed vertically above, that is, in the +Z direction with respect to the inkjet head 6, and the ink is ejected vertically upward, that is, in the +Z direction from the nozzles 7. In addition, a member surrounding the space where the inkjet head 6 passes to switch the scanning direction is disposed such that the vapor supplied from the solvent vapor supply portions 16, which is lighter than the air, stagnates in the space. That is, the region in the X-Y plane where the inkjet head 6 moves is surrounded by side walls 65, and a top wall 62 is provided on the top side of the region surrounded by the side walls 65 such that the side walls 65 and the top wall 62 collectively constitute a surrounding portion.

The members are arranged such that the following relationship is satisfied in the case where the distance from the top wall 62 to the nozzles 7 is H4, the distance from the top wall 62 to the lower ends of the solvent vapor supply portions 16 is H5, and the distance from the top wall 62 to the lower ends of the side walls 65 is H6.

$$H4 < H5 < H6$$

According to such arrangement, the solvent vapor lighter than the air is supplied from the solvent vapor supply portions 16 at positions lower than the horizontal plane in which the nozzles 7 move during scanning, and is retained in the surrounded portion, or a lid portion, surrounded by the top wall 62 and the side walls 65.

Also in the present embodiment, the cleaning portion 18 for cleaning the surface of the nozzles 7 is provided adjacent to the stage 63 in the region surrounded by the top wall 62 and the side walls 65.

In addition, although illustration thereof is omitted, solvent pools are also provided on both sides in the Y direction serving as a sub-scanning direction in the present embodiment similarly to the first embodiment such that the substrate 4 is interposed therebetween.

Also in the present embodiment, the concentration of solvent vapor at each position along a movement path of the inkjet head 6 can be measured by the atmosphere sensors 8 that move accompanied by the inkjet head 6. The controller 14 individually controls the valves 22 of respective positions and the temperature adjustment mechanisms 19A to 19D on the basis of the measured values of respective positions along the movement path, and performs control such that the concentration of solvent vapor at each position along the movement path of the nozzles 7 is equal to or higher than a predetermined concentration.

In the present embodiment, as a result of the control for supply of the solvent vapor and as a result of providing the surrounded portion, or a lid portion, surrounded by the top wall 62 and the side walls 65, the concentration of the solvent vapor in the entirety of the movement path of the nozzles 7 can be stably kept equal to or higher than a predetermined value. Therefore, in the course of the scanning movement of the inkjet head 6 for forming the functional elements, drying of the nozzles 7 can be suppressed even while the inkjet head 6 is moving in a region where ink is not ejected.

The present embodiment is suitably used in the case where, for example, an ink in which conductive fine particles of Ag, Au, Cu, Al, Ni, or the like are dispersed in an aqueous solvent having a lower vapor density than the air is applied in the lower electrode material application step of the OEL element described with reference to FIG. 5A.

Third Embodiment

Figure 7:
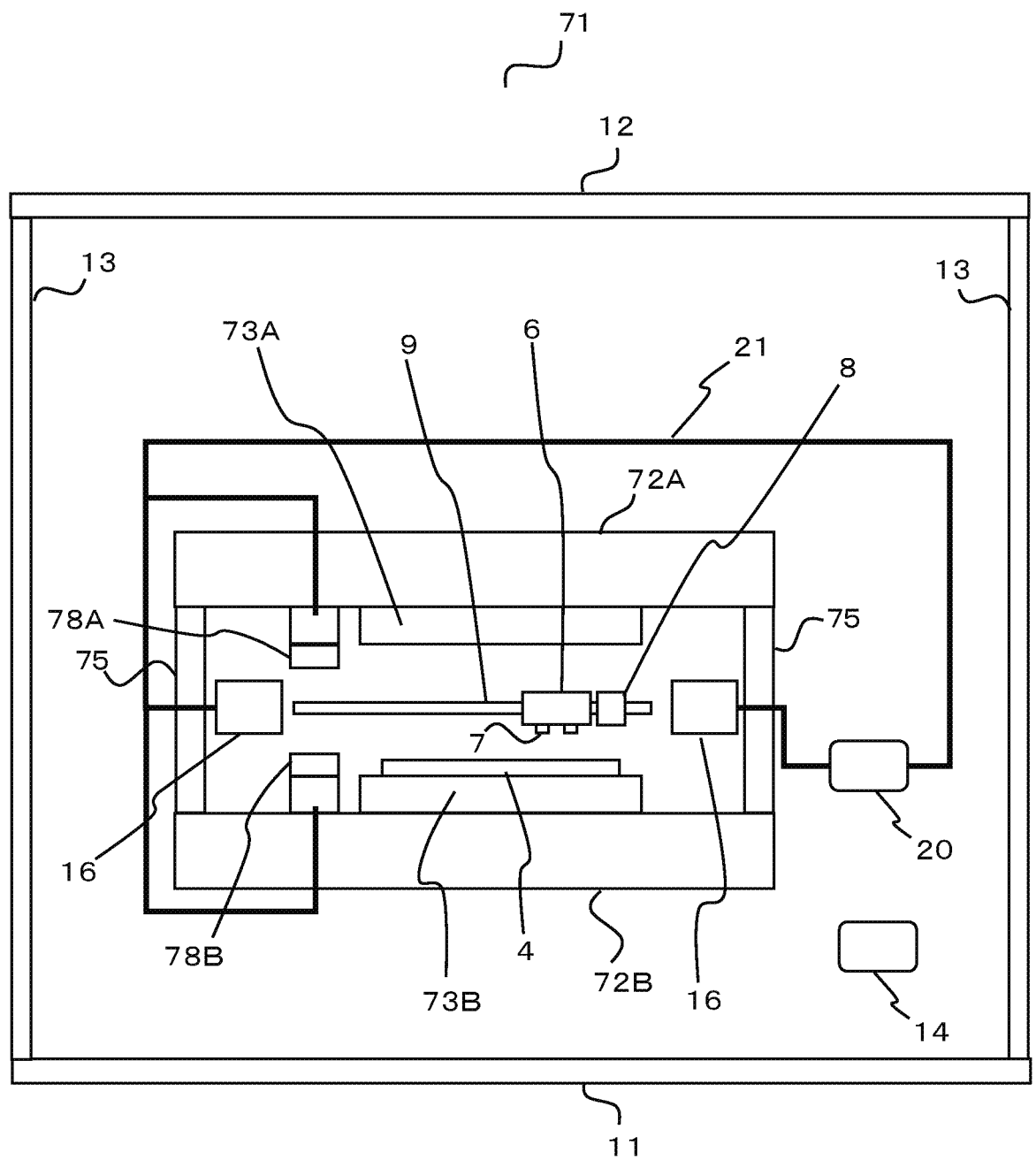
FIG. 7 is a schematic side view of an inkjet apparatus of a third embodiment.

An inkjet apparatus 71 of a third embodiment will be described with reference to FIGS. 7 and 8. FIG. 7 is a schematic side view of the inkjet apparatus 71 of the third embodiment. FIG. 7 illustrates the bottom plate 11, the top plate 12, and the side plates 13 on four sides, and the bottom plate 11, the top plate 12, and the side plates 13 constitute an exterior cover of the inkjet apparatus 71. To be noted, in FIG. 7, illustration of the side plate 13 on the front side of the page surface is omitted to make it easier to see the inside of the apparatus.

Figure 8:
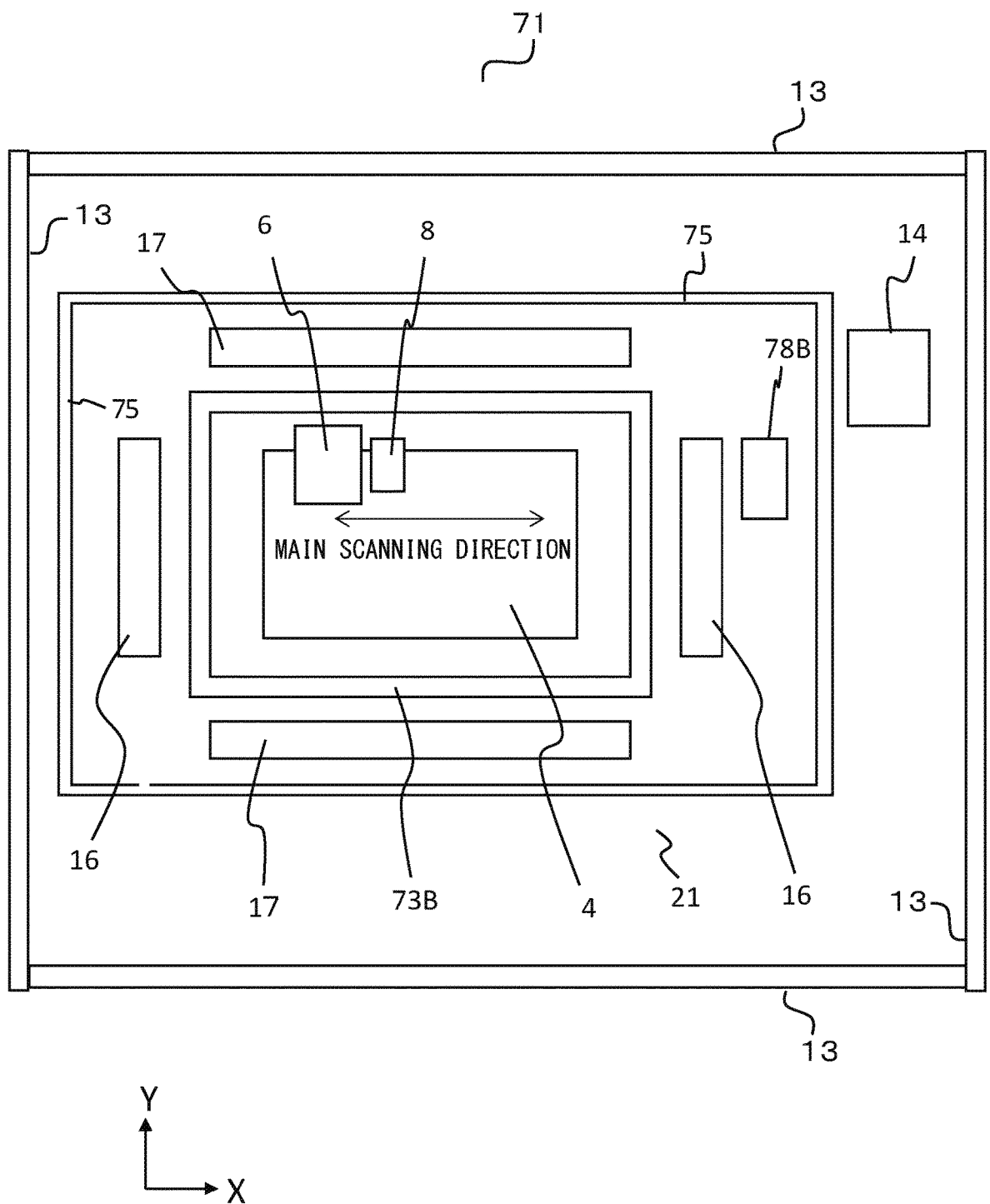
FIG. 8 is a schematic plan view of the inkjet apparatus of the third embodiment.

FIG. 8 is a schematic plan view of the inkjet apparatus 71 of the present embodiment as viewed from above. In FIG. 8, illustration of the top plate 12, a top wall 72A, and so forth is omitted to make it easier to see the inside of the apparatus.

To be noted, the bottom plate 11, the top plate 12, the side plates 13, the inkjet head 6, the atmosphere sensors 8, the main scanning guide rail 9, the controller 14, the solvent vapor supply portions 16, the solvent pools 17, the tank 20, and the liquid flow path 21 have the same functions as in the first embodiment, and therefore description thereof will be omitted. In addition, for the sake of simplicity of illustration, illustration of the sub scanner 24 and the sub-scanning guide rail 10 is omitted in FIG. 7, and illustration of main scanning and sub-scanning mechanisms is omitted in FIG. 8.

In the inkjet apparatus 1 of the first embodiment, a material having a higher vapor density than the air is used as the solvent of the ink, and in the inkjet apparatus 61 of the second embodiment, a material having a lower vapor density than the air is used as the solvent of the ink. In contrast, the inkjet apparatus 71 of the third embodiment is capable of using either of the material having a higher vapor density than the air and the material having a lower vapor density than the air.

The inkjet apparatus 71 includes an upper stage 73A disposed vertically above, that is, in the +Z direction with respect to the inkjet head 6, and a lower stage 73B disposed vertically below, that is, in the −Z direction with respect to the inkjet head 6. In addition, the inkjet head 6 includes an ejection direction switching mechanism capable of switching the ejection direction of the ink from the nozzles 7 between a vertically upward direction, that is, the +Z direction, and a vertically downward direction, that is, the −Z direction. For example, the ejection direction switching mechanism is a mechanism capable of rotating the inkjet head 6 by 180° about the main scanning guide rail 9 as a rotation shaft. To be noted, the inkjet apparatus 71 includes a cleaning portion 78A that is used when the nozzles 7 are directed upward, and a cleaning portion 78B that is used when the nozzles 7 are directed downward.

In the case of forming functional elements by using an ink containing a material having a higher vapor density than the air as a solvent, the substrate on which the functional elements are to be formed is set on the lower stage 73B, and the inkjet head 6 switches the ejection direction of the ink from the nozzles 7 to the vertically downward direction, that is, the −Z direction. FIGS. 7 and 8 schematically illustrate this state. In contrast, in the case of forming functional elements by using an ink containing a material having a lower vapor density than the air as a solvent, the substrate on which the functional elements are to be formed is set on the upper stage 73A, and the inkjet head 6 switches the ejection direction of the ink from the nozzles 7 to the vertically upward direction, that is, the +Z direction.

In the inkjet apparatus 1 of the first embodiment, a surrounded portion, or a tank portion, surrounded by the bottom wall 2 and the side walls 15 is provided for stably stagnating the solvent vapor in the entirety of the movement path of the inkjet head 6. In addition, in the inkjet apparatus 61 of the second embodiment, a surrounded portion, or a lid portion, surrounded by the top wall 62 and the side walls 65 is provided for stably stagnating the solvent vapor in the entirety of the movement path of the inkjet head 6. In the present embodiment, a surrounding portion that three-dimensionally surrounds the entirety of the movement path of the inkjet head 6 is formed by providing a top wall 72A, side walls 75, and a bottom wall 72B to stably stagnate the solvent vapor in the entirety of the movement path regardless of whether the solvent vapor is heavier or lighter than the air.

Also in the present embodiment, the concentration of solvent vapor at each position along the movement path of the inkjet head 6 can be measured by the atmosphere sensors 8 that move accompanied by the inkjet head 6. The controller 14 individually controls the valves 22 of respective positions and the temperature adjustment mechanisms 19A to 19D on the basis of the measured values of respective positions along the movement path, and performs control such that the concentration of solvent vapor at each position along the movement path of the nozzles 7 is equal to or higher than a predetermined concentration.

In the present embodiment, as a result of the control for supply of the solvent vapor and as a result of surrounding the entirety of the movement path of the nozzles 7 by the top wall 72A, the side walls 75, and the bottom wall 72B, the concentration of the solvent vapor can be stably kept equal to or higher than a predetermined value regardless of which solvent is used for the ink. Therefore, in the course of the scanning movement of the inkjet head 6 for forming the functional elements, drying of the nozzles 7 can be suppressed even while the inkjet head 6 is moving in a region where ink is not ejected.

Fourth Embodiment

Figure 12:
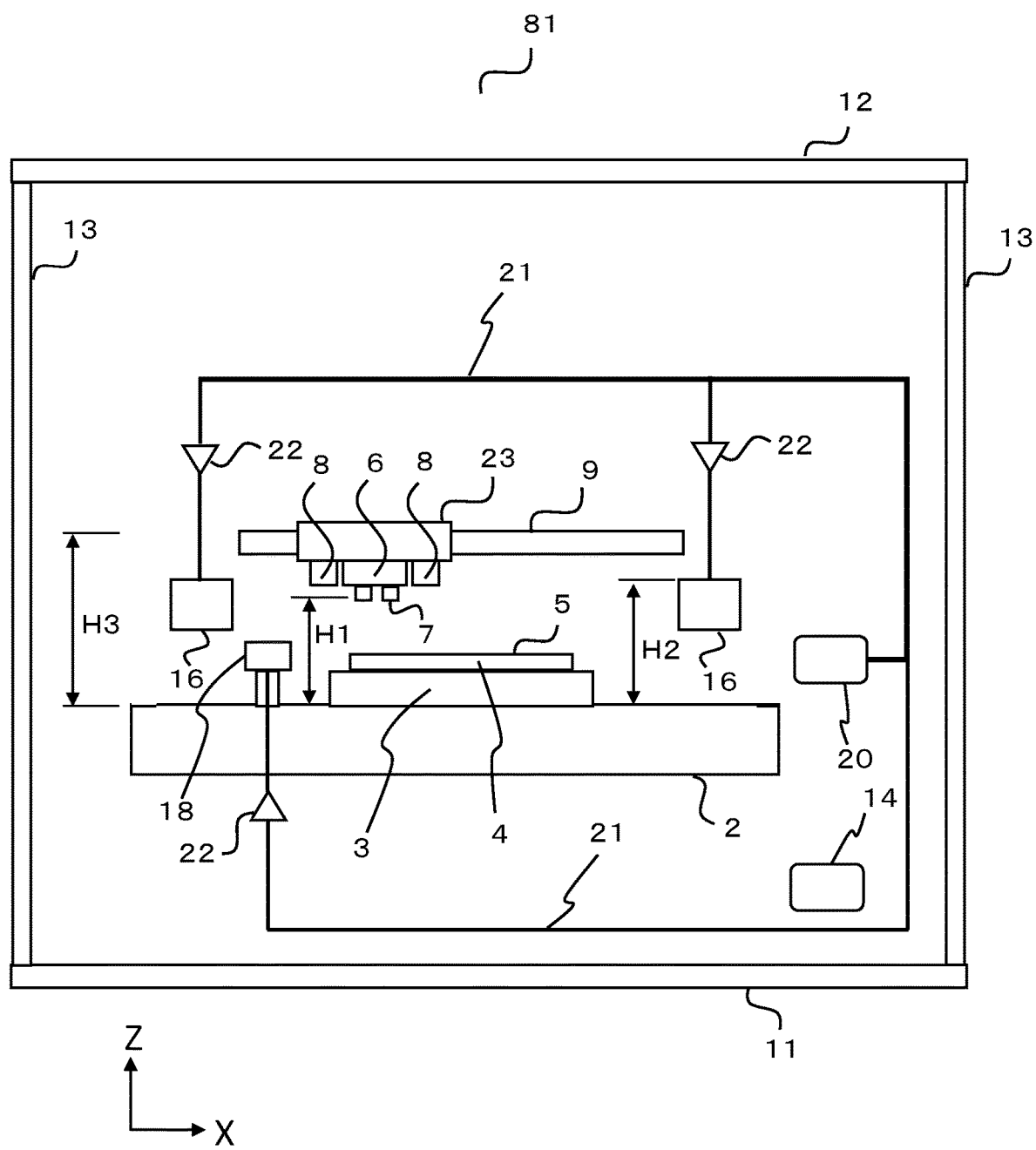
FIG. 12 is a schematic side view of an inkjet apparatus of a fourth embodiment.

An inkjet apparatus 81 of a fourth embodiment will be described with reference to FIGS. 12 and 13. FIG. 12 is a schematic side view of the inkjet apparatus 81 of the fourth embodiment. FIG. 12 illustrates the bottom plate 11, the top plate 12, and the side plates 13 on four sides, and the bottom plate 11, the top plate 12, and the side plates 13 constitute an exterior cover of the inkjet apparatus 81. To be noted, in FIG. 12, illustration of the side plate 13 on the front side of the page surface is omitted to make it easier to see the inside of the apparatus.

To be noted, the inkjet head 6, the nozzles 7, the atmosphere sensors 8, the main scanning guide rail 9, the controller 14, the solvent vapor supply portions 16, the tank 20, the liquid flow path 21, and the valves 22 have the same functions as in the first embodiment, and therefore description thereof will be omitted. In addition, for the sake of simplicity of illustration, illustration of the sub scanner 24 and the sub-scanning guide rail 10 is omitted in FIG. 12.

Figure 13:
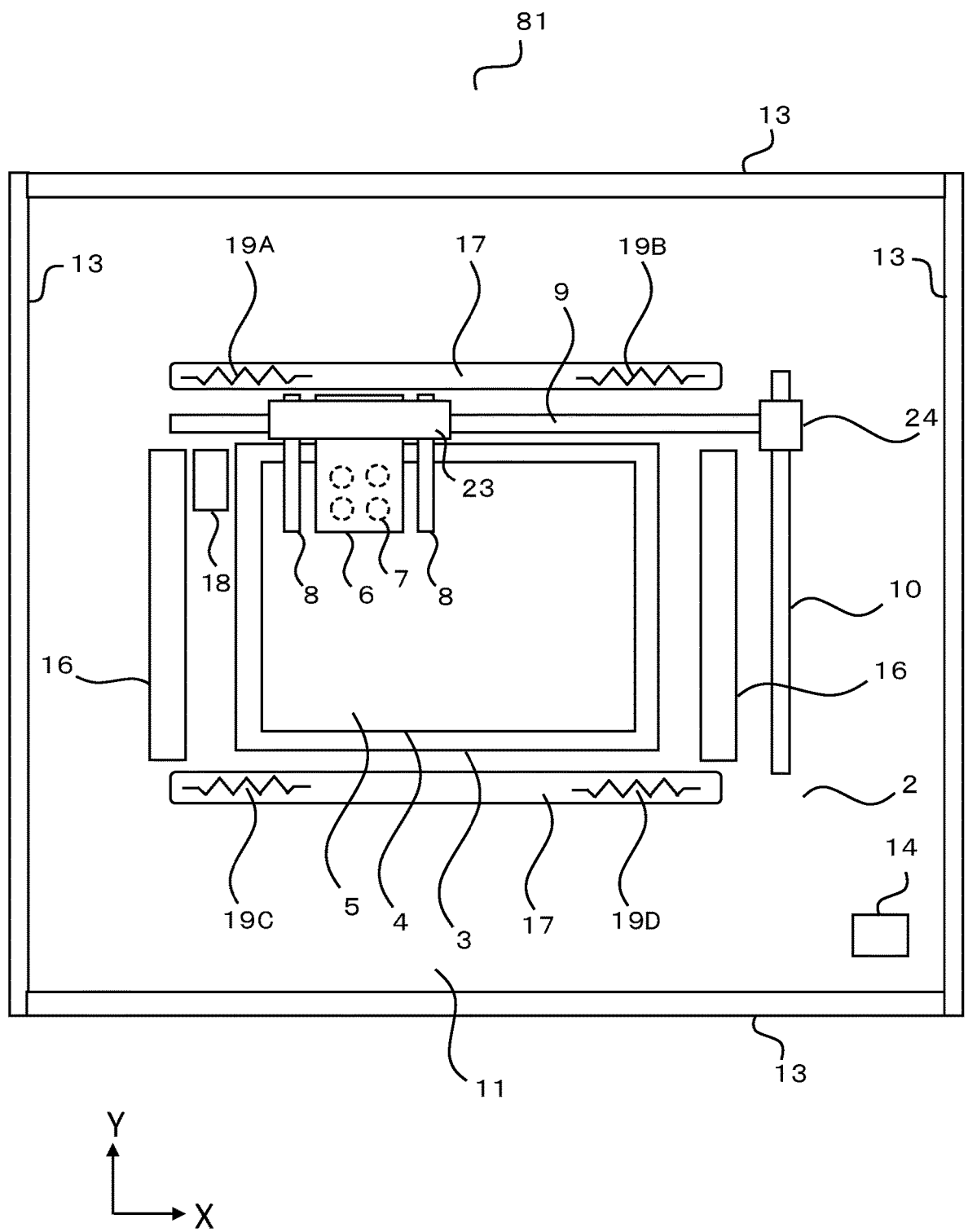
FIG. 13 is a schematic plan view of the inkjet apparatus of the fourth embodiment.

In addition, FIG. 13 is a schematic plan view of the inkjet apparatus 81 of the present embodiment as viewed from above. In FIG. 13, illustration of the top plate 12 is omitted to make it easier to see the inside of the apparatus.

In the embodiments described above, a member to surround the space where the inkjet head 6 moves when switching the scanning direction is provided in addition to the exterior cover so as to stagnate the vapor supplied from the solvent vapor supply portions 16 in the space. However, to stagnate the vapor supplied from the solvent vapor supply portions 16 in this space, an appropriately designed exterior cover may be used as at least a part of the surrounding portion.

In the present embodiment, a predetermined region in which the inkjet head is moved by the scanning mechanism in plan view of the substrate surface and which includes a height where the nozzle surface of the inkjet head in side view of the substrate is surrounded by the side plates 13. In the present embodiment, the bottom side and top side of the region where the inkjet head is moved by the scanning mechanism are surrounded by the bottom plate 11 and the top plate 12, and thus the solvent vapor can be stagnated around the inkjet head moving in a scanning manner, regardless of the density of the solvent vapor. In the case of applying an ink containing a solvent having a higher vapor density than the air, the substrate surface is disposed vertically below the inkjet head, and the inkjet head ejects the ink vertically downward. In contrast, in the case of applying an ink containing a solvent having a lower vapor density than the air, the substrate surface is disposed vertically above the inkjet head, and the inkjet head ejects the ink vertically upward.

However, in the case where the density of the solvent vapor of the ink to be used is determined in advance, the exterior cover serving as the surrounding portion may be provided to surround only a height range required for stagnating the solvent vapor.

In the present embodiment in which the exterior cover is used for stagnating the vapor supplied from the solvent vapor supply portions 16, the volume of the surrounded space is larger than in the other embodiments, and therefore the solvent supply power of the solvent vapor supply portions 16 is set to be sufficiently high.

Other Embodiments

Embodiments of the present invention are not limited to the first to fourth embodiments described above, and can be appropriately modified or combined.

For example, although the substrate is fixed to a stage and the scanning is performed by moving the inkjet head in both the X direction and the Y direction in the embodiments described above, the scanning mechanism is not limited to this. It suffices as long as relative scanning movement can be performed by controlling the relative positions of the substrate and the inkjet head, and therefore the scanning mechanism may be, for example, a mechanism that moves the inkjet head in the main scanning direction and the substrate in the sub-scanning direction to perform the scanning movement. In addition, the method of scanning is not limited to that illustrated in FIG. 11, and for example, the scanning may be performed on every other column in an interlaced manner in forward and backward movement instead of scanning adjacent columns in the forward and backward movement.

In addition, the means for supplying the vapor of the same material as a component contained in the solvent of the ink for controlling the atmosphere is not limited to the porous body or the solvent pools, and the arrangement thereof is neither limited to the examples of the embodiments described above. For example, a mist sprayer that sprays a mist of the same material as a component contained in the solvent of the ink may be used. In addition, the temperature adjustment mechanism for controlling the amount of supply of the vapor is not limited to a heater, and may be other heating means or a cooling means such as a Peltier device.

In addition, the atmosphere sensor is not limited to a sensor that moves accompanied by the inkjet head as long as the atmosphere sensor is disposed to be able to measure the concentration of the solvent vapor in the vicinity of the movement path of the inkjet head. For example, a plurality of fixed atmosphere sensors may be disposed in the region 107 of FIG. 11 in a scattered manner.

In addition, the shape of the surrounding portion is not limited to a tank, lid, or enclosure as long as the surrounding portion is designed in accordance with the density of the vapor with respect to the air such that the vapor can be stably stagnated in the movement region of the nozzles.

In addition, in the case of manufacturing an OEL element as a functional element, the present invention can be applied to application of an ink containing a material of each layer such as a light emitting layer, an electron transport layer, an electron injection layer, a hole transport layer, a hole injection layer, or an electrode. Of course, the present invention can be also widely applied to manufacture of functional elements other than OEL elements, and for example, can be suitably applied to a case of forming an antistatic film or an antireflection film of a large area.

Example 1

A specific example of the first embodiment will be described below.

The process of FIG. 5C, that is, a step of applying an ink containing the light emitting material of an OEL element in a region surrounded by a bank was performed by using the inkjet apparatus 1 illustrated in FIGS. 1 to 3. Before this step, a structure illustrated in FIG. 4E was formed on the substrate 41 formed from glass, and this was set in the inkjet apparatus 1 as the substrate 4. As the inkjet head, a piezoelectric head that pushes out an ink by displacement of a lead zirconate titanate element: PZT element was used, and the number of nozzles was set to 80.

The light emitting portion of the OEL element was formed by applying an ink in which the following high-molecular-weight material was dissolved in xylene. Examples of the high-molecular-weight material of the light emitting portion include poly(p-phenylene vinylene) derivatives, polythiophene derivatives, poly(p-phenylene) derivatives, polysilane derivatives, polyacetylene derivatives, polyfluorene derivatives, and polyvinylcarbazole derivatives.

As the solvent vapor supply portions 16, sponges of foamed polyethylene were used. The liquid supplied to the solvent vapor supply portions 16 and the solvent pools 17 was xylene, and this liquid was supplied to the solvent vapor supply portions 16 through the liquid supply system constituted by the tank 20, the liquid flow path 21, and the valves 22 by using a pump. To be noted, the vapor density of xylene is 3.66, which is larger than that of the air.

The controller 14 controlled each component such that the xylene concentration in the space where the inkjet head moved was within a predetermined range, on the basis of the xylene concentration measured by using the atmosphere sensors 8. Specifically, the xylene concentration was kept equal to or higher than 4500 ppm to suppress drying of the nozzles. In addition, the xylene concentration was kept equal to or lower than 5500 ppm to suppress condensation. That is, the controller 14 adjusted the pump, the valves, the temperature adjustment mechanisms, and so forth such that the xylene concentration was within the range of 5000 ppm±10%. To be noted, as an atmosphere measurement sensor, an organic solvent detector capable of detecting the concentration of a flammable gas up to 10000 ppm.

Figure 9:
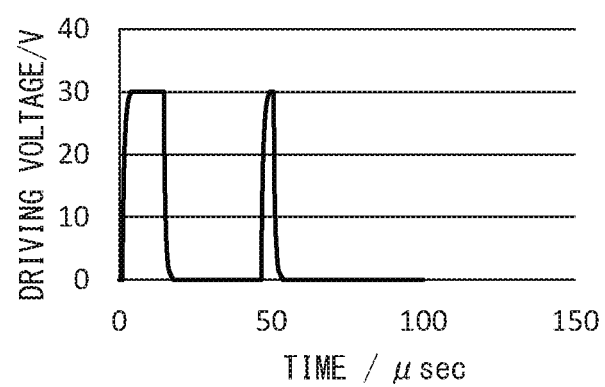
FIG. 9 is a driving waveform diagram of an inkjet head of examples.

FIG. 9 illustrates a driving waveform of the inkjet head used in this example at the time of ejection. FIG. 9 illustrates a case where the driving voltage was 30 V. Since the characteristics of ejection slightly differed between nozzles, observation of ejection was performed before the ejection for the light emitting portion, and adjustment was performed to equalize the ejection speed and ejection amount between the nozzles.

Figure 10:
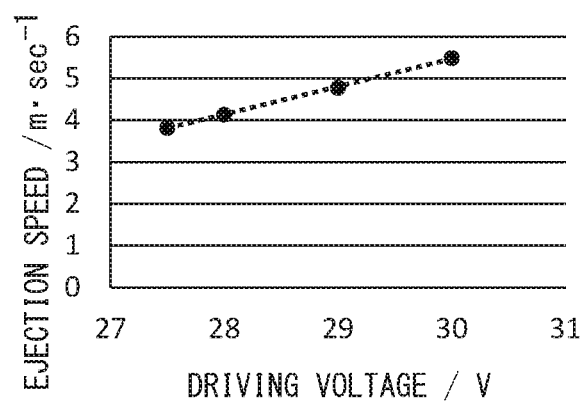
FIG. 10 is an ejection characteristic diagram of the inkjet head of examples.

FIG. 10 illustrates a relationship between the ejection speed and the driving voltage of this example. The ejection speed was set to 5 m/sec, and the driving voltage was adjusted such that the ejection speed of each nozzle was within the range of 5±0.1 m/sec.

Banks into which the ink containing a light emitting material are shot are provided in 3840 columns×2160 rows, and one dot of ink droplet was ejected into each bank. Since the number of driven nozzles was 80, 118 cycles of reciprocation were necessary for covering the entirety in the scanning, and in the case where the scanning speed was set to 200 mm/sec, it took about 540 seconds for covering the entirety in consideration of also the acceleration and deceleration of the inkjet head.

In the case where no restoration or atmosphere control was performed at this time, the ejection state was unstabilized by attachment of ink mist or foreign matter to the nozzle surface, solidification of ink component at the opening portions of the nozzles, or change overtime, and the ink hitting positions were displaced.

The pixel pitch of the OEL panel to be manufactured was 230 µm. To obtain a standard light emission intensity by shooting ink droplets for forming light emitting portions into the banks arranged at this pitch, the root mean square of the hitting position deviation in the X direction serving as the main scanning direction and in the Y direction serving as the sub-scanning direction had to be equal to or smaller than 11.2 µm.

The ink hitting position in the X direction can be controlled by correcting the timing of ejection. However, in the Y direction, the ink hitting position cannot be adjusted by correcting the timing. Therefore, the hitting budget was set to ±10 µm in the Y direction while the margin of the ink hitting portion was set to ±5 µm in the X direction.

As described above, in this example, the ejection speed was set to 5 m/sec, and the scanning speed of the inkjet head was set to 200 mm/sec. Since the gap between the substrate and the inkjet head during ejection was set to 200 for example, in the case where the hitting position deviation in the scanning direction was 5 µm in the scanning direction, the hitting position deviation could be addressed by changing the ejection timing by 25 pec.

The ink hitting position of each nozzle was adjusted by the above method by using an ink hitting image measured in advance, and formation of light emitting portions was performed.

Results of the ink hitting of this example are shown in Table 1

TABLE 1

| | x/μm | | y/μm | | $\sqrt{(x^2 + y^2)}$/μm | |
|---|---|---|---|---|---|---|
| | | | Standard | | | |
| | ±5 | | ±10 | | <11.2 | |
| | | | Xylene | | | |
| | 0 ppm | 5000 ppm | 0 ppm | 5000 ppm | 0 ppm | 5000 ppm |
| Restoration | No | No | No | No | No | No |
| Ink Hitting Position | ±6.1 | ±4.5 | ±14.4 | ±10.8 | 14.7 | 11.0 |
| Ave. | −1.5E−04 | −1.0E−04 | −1.2E−15 | −4.3E−18 | 5.2 | 3.9 |
| σ | 1.5 | 1.1 | 6.0 | 4.4 | 3.3 | 2.5 |

In the case where no xylene vapor was supplied from the solvent vapor supply portions 16 and the solvent pools 17, the root mean square of the hitting position deviation of the ink for forming the light emitting portions in the X and Y directions was 14.7, which was larger than the standard value. The light emission intensity of these elements had variations of about 1.5%.

In contrast, in the case where the ejection was performed by adjusting the xylene concentration in the atmosphere within the range of 5000 ppm±10%, the root mean square of overall hitting position deviation in the X and Y directions was 11.0, which was within the range of standard value, without performing restoration. The variations of the light emission intensity of these elements were as small as 0.7%, and it was confirmed that the ejection and ink hitting positions were stabilized by controlling the xylene concentration in the atmosphere.

Example 2

The same configuration as Example 1 was employed, and restoration operation was performed by using the cleaning portion 18 every time 10 columns in the main scanning direction were scanned.

In the cleaning portion 18, a sponge of foamed polyethylene processed into a cylindrical shape was used as a wiping member. The wiping member was impregnated with xylene, and the wiping member was moved in a wet state so as to abut the nozzle surface of the inkjet head. The wiping was performed by using the scanning movement of the inkjet head.

The results of Example 2 are shown in Table 2

TABLE 2

| | x/μm | | y/μm | | $\sqrt{(x^2 + y^2)}$/μm | |
|---|---|---|---|---|---|---|
| | | | Standard | | | |
| | ±5 | | ±10 | | <11.2 | |
| | | | Xylene | | | |
| | 0 ppm | 5000 ppm | 0 ppm | 5000 ppm | 0 ppm | 5000 ppm |
| Restoration | No | Yes | No | Yes | No | Yes |
| Ink Hitting Position | ±6.1 | ±4.2 | ±14.4 | ±10 | 14.7 | 10.2 |
| Ave. | −1.5E−04 | −9.7E−05 | −1.2E−15 | −1.1E−15 | 5.2 | 3.6 |
| σ | 1.5 | 1.0 | 6.0 | 4.1 | 3.3 | 2.3 |

In this example, the ink hitting stability was increased by performing the restoration operation in addition to controlling the xylene concentration in the atmosphere. The root mean square of the hitting position deviation in the X and Y directions in the entirety of the formed dots was 10.2, and the standard deviation σ was 2.3. The variations of light emission intensity of these elements were as small as 0.5%.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An inkjet apparatus configured to apply an ink containing a material of a functional element on a substrate surface, the inkjet apparatus comprising:
    an inkjet head including a nozzle configured to eject the ink;
    a scanning mechanism configured to control relative positions of the inkjet head and the substrate surface;
    a surrounding portion surrounding a region in which the inkjet head is moved by the scanning mechanism in plan view of the substrate surface, and configured such that the surrounding portion overlaps with a predetermined region including a height at which the nozzle is placed in side view of the substrate surface;
    a liquid supply system configured to supply liquid to the region surrounded by the surrounding portion in plan view of the substrate surface; and
    a vapor supply portion provided in the region surrounded by the surrounding portion in plan view of the substrate surface and configured to supply a vapor of the liquid supplied from the liquid supply system to the region surrounded by the surrounding portion.

2. The inkjet apparatus according to claim 1, further comprising an exterior cover of the inkjet apparatus, wherein the surrounding portion is provided between the region in which the inkjet head is moved by the scanning mechanism and the exterior cover.

3. The inkjet apparatus according to claim 1, further comprising an exterior cover of the inkjet apparatus, wherein the liquid supply system comprises a tank configured to retain the liquid, the tank being provided between the inkjet head and the exterior cover.

4. The inkjet apparatus according to claim 1,
wherein a density of the vapor is higher than a density of air, and
wherein the surrounding portion surrounds a region lower than a height at which the nozzle surface of the inkjet head is disposed in side view of the substrate surface.

5. The inkjet apparatus according to claim 1,
wherein a density of the vapor is lower than a density of air, and
wherein the surrounding portion surrounds a region higher than a height at which the nozzle surface of the inkjet head is disposed in side view of the substrate surface.

6. The inkjet apparatus according to claim 1,
wherein in a case where the ink to be applied contains a solvent whose vapor has a higher density than that of air, the substrate surface is disposed vertically below the inkjet head and the inkjet head is configured to eject the ink vertically downward.

7. The inkjet apparatus according to claim 1, further comprising a stage on which a substrate having the substrate surface is set,
wherein the vapor supply portion is disposed between the stage and the surrounding portion, around the substrate surface, or outside the substrate surface, in plan view of the substrate surface.

8. The inkjet apparatus according to claim 1, wherein the vapor supply portion comprises a porous body wet with the liquid.

9. The inkjet apparatus according to claim 1, wherein the vapor supply portion comprises a pool configured to retain the liquid.

10. The inkjet apparatus according to claim 1, wherein the vapor supply portion comprises a sprayer configured to spray a mist of the liquid.

11. The inkjet apparatus according to claim 1, wherein a cleaning member configured to clean the nozzle surface of the inkjet head is disposed within a region surrounded by the surrounding portion in plan view of the substrate surface.

12. The inkjet apparatus according to claim 1, further comprising a measurement portion provided in the region surrounded by the surrounding portion in plan view of the substrate surface and configured to measure a concentration of the vapor,
wherein the vapor supply portion controls an amount of the vapor to be supplied, in accordance with a measurement result of the measurement portion.

13. The inkjet apparatus according to claim 12, wherein the measurement portion is supported by the scanning mechanism so as to move with the inkjet head moved by the scanning mechanism.

14. The inkjet apparatus according to claim 12, wherein the measurement portion is provided outside the substrate surface in plan view of the substrate surface.

15. The inkjet apparatus according to claim 12, wherein the measurement portion measures the concentration of the vapor in an atmosphere at a height of the nozzle surface of the inkjet head.

16. A method for manufacturing a functional element, the method comprising:
preparing the inkjet apparatus according to claim 1; and
operating the inkjet apparatus to apply an ink containing a material of the functional element on the substrate surface.

17. The method according to claim 16, wherein the ink contains a material of a light emitting layer, an electron transport layer, an electron injection layer, a hole transport layer, a hole injection layer, or an electrode of an organic electroluminescence element.

18. The inkjet apparatus according to claim 1,
wherein in a case in which the ink to be applied contains a solvent whose vapor has a density lower than that of air, the substrate surface is disposed vertically above the inkjet head and the inkjet head is configured to eject the ink vertically upward.

19. The inkjet apparatus according to claim 1, wherein the liquid includes the same material as a component of the solvent contained in the ink.

20. The inkjet apparatus according to claim 1, wherein the scanning mechanism is configured to control relative positions of the inkjet head and the substrate surface such that the inkjet head and the substrate surface relatively reciprocate in a main scanning direction and such that the inkjet head and the substrate surface relatively move in a sub-scanning direction in a case in which forward movement and backward movement are switched during the reciprocation.

21. An inkjet apparatus configured to apply an ink containing a material of a functional element on a substrate surface, the inkjet apparatus comprising:
an inkjet head;
a scanning mechanism configured to control relative positions of the inkjet head and the substrate surface such that the inkjet head and the substrate surface relatively reciprocate in a main scanning direction and such that the inkjet head and the substrate surface relatively move in a sub-scanning direction in a case in which forward movement and backward movement are switched during the reciprocation;
a surrounding portion surrounding a predetermined region in which the inkjet head is moved by the scanning mechanism in plan view of the substrate surface, and configured such that the surrounding portion overlaps with a nozzle surface of the inkjet head in side view of the substrate surface; and
a vapor supply portion provided outside the substrate surface and in the region surrounded by the surrounding portion in plan view of the substrate surface and configured to supply a vapor of the same material as a component of a solvent contained in the ink to the region surrounded by the surrounding portion,
wherein in a case in which the ink to be applied contains a solvent whose vapor has a higher density than that of air, the substrate surface is disposed vertically below the inkjet head and the inkjet head is configured to eject the ink vertically downward, and
wherein in a case in which the ink to be applied contains a solvent whose vapor has a density lower than that of air, the substrate surface is disposed vertically above the inkjet head and the inkjet head is configured to eject the ink vertically upward.

22. A method for manufacturing a functional element, the method comprising:
preparing the inkjet apparatus according to claim 21; and
operating the inkjet apparatus to apply the ink containing a material of the functional element on the substrate surface.

23. The method according to claim 22, wherein the ink contains a material of a light emitting layer, an electron transport layer, an electron injection layer, a hole transport layer, a hole injection layer, or an electrode of an organic electroluminescence element.

* * * * *